United States Patent
Nakabayashi et al.

(10) Patent No.: US 7,933,100 B2
(45) Date of Patent: Apr. 26, 2011

(54) TUNNELING MAGNETIC SENSOR INCLUDING FREE MAGNETIC LAYER AND MAGNESIUM PROTECTIVE LAYER DISPOSED THEREON

(75) Inventors: Ryo Nakabayashi, Niigata-ken (JP); Kazumasa Nishimura, Niigata-ken (JP); Yosuke Ide, Niigata-ken (JP); Masahiko Ishizone, Niigata-ken (JP); Masamichi Saito, Niigata-ken (JP); Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 926 days.

(21) Appl. No.: 11/888,762

(22) Filed: Aug. 2, 2007

(65) Prior Publication Data

US 2008/0253038 A1 Oct. 16, 2008

(30) Foreign Application Priority Data

Aug. 30, 2006 (JP) ................ 2006-234464

(51) Int. Cl.
*G11B 5/39* (2006.01)
(52) U.S. Cl. .................................. 360/324.2
(58) Field of Classification Search .............. 360/324.2; 365/145, 158, 171–173; 257/421–427; 428/811.1, 428/812

See application file for complete search history.

(56) References Cited

U.S. PATENT DOCUMENTS 7,252,852 B1 * 8/2007 Parkin ........................ 427/131
7,595,520 B2 * 9/2009 Horng et al. ................ 257/295

FOREIGN PATENT DOCUMENTS

| JP | 11-161919 | 6/1999 |
| JP | 2000-228003 | 8/2000 |
| JP | 2005-109378 | 4/2005 |
| JP | 2005-191312 | 7/2005 |
| JP | 2006-5356 | 1/2006 |

* cited by examiner

*Primary Examiner* — A. J. Heinz
(74) *Attorney, Agent, or Firm* — Brinks Hofer Gilson & Lione

(57) ABSTRACT

A tunneling magnetic sensor includes a pinned magnetic layer of which the magnetization is pinned in one direction, an insulating barrier layer, and a free magnetic layer of which the magnetization is varied by an external magnetic field, these layers being arranged in that order from the bottom. A first protective layer made of magnesium (Mg) is disposed on the free magnetic layer. The tunneling magnetic sensor has a larger change in reluctance as compared to conventional magnetic sensors including no first protective layers or including first protective layers made of Al, Ti, Cu, or an Ir—Mn alloy. The free magnetic layer has lower magnetostriction as compared to free magnetic layers included in the conventional magnetic sensors.

7 Claims, 6 Drawing Sheets

TUNNELING MAGNETIC SENSOR INCLUDING FREE MAGNETIC LAYER AND MAGNESIUM PROTECTIVE LAYER DISPOSED THEREON

CLAIM OF PRIORITY

This application claims benefit of the Japanese Patent Application No. 2006-234464 filed on Aug. 30, 2006, which is hereby incorporated by reference.

BACKGROUND OF THE INVENTION

1. Field of the Invention

The present invention relates to magnetic sensors, using tunnel effect, for magnetic detecting devices or magnetic storage devices such as hard disk drives. The present invention particularly relates to a tunneling magnetic sensor which includes a free magnetic layer having low magnetostriction ($\lambda$) and which has a large change in reluctance ($\Delta R/R$), high detection sensitivity, and high stability and also relates to a method for manufacturing the tunneling magnetic sensor.

2. Description of the Related Art

A tunneling magnetic sensor (tunneling magnetoresistive element) causes a change in reluctance using tunnel effect. When the magnetization of a pinned magnetic layer is antiparallel to that of a free magnetic layer, a tunnel current is prevented from flowing through an insulating barrier layer (tunnel barrier layer) disposed between the pinned and free magnetic layers, resulting in the maximum resistance. In contrast, when the magnetization of the pinned magnetic layer is parallel to that of the free magnetic layer, the tunnel current readily flows through the insulating barrier layer, resulting in the minimum resistance.

Since the magnetization of the free magnetic layer is varied by the influence of an external electric field, the tunneling magnetic sensor uses this principle to detect a change in electric resistance as a change in voltage, thereby detecting a magnetic field leaking from a recording medium.

Japanese Unexamined Patent Application Publication No. 11-161919 (hereinafter referred to as Patent Document 1) discloses a tunneling magnetic sensor including a pinned magnetic layer and free magnetic layer having a multilayer structure.

Japanese Unexamined Patent Application Publication No. 2005-191312 (hereinafter referred to as Patent Document 2) discloses a spin-valve magnetoresistive element including a free magnetic layer, a protective layer, and a spin filter layer disposed therebetween.

Japanese Unexamined Patent Application Publication No. 2006-5356 (hereinafter referred to as Patent Document 3) discloses a tunneling magnetic sensor including an aluminum oxide insulating barrier layer, a free magnetic layer, and a protective layer which includes an internal diffusion barrier sublayer, an oxygen-adsorbing layer, and an upper metal sublayer arranged above the protective layer in that order.

One of challenges for tunneling magnetic sensors is to enhance the sensitivity by increasing the change in reluctance to enhance properties of reproducing heads. One of techniques for increasing the change in reluctance of the tunneling magnetic sensors is that layers of materials having high spin polarizability are placed between free magnetic layers and insulating barrier layers.

Ferromagnetic materials, such as iron (Fe), nickel (Ni), and cobalt (Co), for forming the pinned and free magnetic layers of the tunneling magnetic sensors have slight distortion (magnetostriction) if the ferromagnetic materials are magnetized. An increase in the Fe content of alloys, such as a Ni—Fe alloy, a Co—Fe alloy, and a Ni—Co—Fe alloy, containing some of the ferromagnetic materials increases the spin polarizability and the change in reluctance. However, an increase in Fe content causes the free magnetic layers to have a large positive magnetostriction. An increase in the absolute value of the magnetostriction of the free magnetic layers causes noise in the reproducing heads, resulting in a problem that the reproducing heads have low stability. Hence, the absolute value of the magnetostriction is preferably small (nearly zero) and the change in reluctance is preferably large.

In the tunneling magnetic sensor disclosed in Patent Document 1, the free magnetic layer includes two Ni—Fe sublayers and a Co or Co—Fe layer. The composition of each Ni—Fe sublayer is appropriately adjusted and the Co or Co—Fe layer is placed between the free magnetic layer and an insulating barrier layer such that the free magnetic layer has low magnetostriction.

Patent Document 2 discloses that the change in reluctance of the magnetoresistive element can be enhanced by appropriately selecting a material for forming the free magnetic layer. In view of practical use, a Ni—Fe—Co alloy of which the composition is adjusted to reduce the magnetostriction is used to form the free magnetic layer.

As described above, the magnetostriction can be reduced by adjusting the material composition of the free magnetic layer or using such a low-magnetostriction alloy; however, the composition of the free magnetic layer that is adjusted to achieve low magnetostriction is not effective in achieving a large change in reluctance.

In the tunneling magnetic sensor disclosed in Patent Document 3, the internal diffusion barrier sublayer, oxygen-adsorbing layer, and upper metal sublayer of the protective layer are made of ruthenium (Ru), tantalum (Ta), and Ru, respectively. Therefore, this tunneling magnetic sensor has low magnetostriction and a large change in reluctance. However, the change in reluctance thereof is still insufficient.

The conventional structures described above are not effective in achieving low magnetostriction and a large change in reluctance.

SUMMARY OF THE INVENTION

The present invention provides a tunneling magnetic sensor which has a larger change in reluctance as compared to conventional sensors and which includes a free magnetic layer having low magnetostriction and also provides a method for manufacturing the tunneling magnetic sensor.

A tunneling magnetic sensor according to an embodiment of the present invention includes a pinned magnetic layer of which the magnetization is pinned in one direction, an insulating barrier layer, and a free magnetic layer of which the magnetization is varied by an external magnetic field, these layers being arranged in that order from the bottom. A first protective layer made of magnesium (Mg) is disposed on the free magnetic layer.

Since the first protective layer, which is made of magnesium (Mg), is disposed on the free magnetic layer, the free magnetic layer has low magnetostriction and the tunneling magnetic sensor has a large change in reluctance.

In the tunneling magnetic sensor, elements contained in the first protective layer and the free magnetic layer may diffuse through the interface between the first protective layer and the free magnetic layer and the concentration gradient of magnesium may be established such that the concentration of magnesium in the first protective layer gradually decreases from an internal portion of the first protective layer toward the interface between the free magnetic layer and the insulating barrier layer.

The tunneling magnetic sensor preferably further includes a second protective layer, made of tantalum (Ta), disposed on the first protective layer because the free magnetic layer can be protected from oxidation.

In the tunneling magnetic sensor, elements contained in the first and second protective layers may diffuse through the interface between the first and second protective layers and the concentration gradient of magnesium may be established such that the concentration of magnesium in the first protective layer gradually decreases from an internal portion of the first protective layer toward the upper face of the second protective layer.

In the tunneling magnetic sensor, the first protective layer preferably has a thickness less than that of the second protective layer.

In the tunneling magnetic sensor, it is preferable the free magnetic layer include an enhancement sublayer made of a Co—Fe alloy and a soft magnetic sublayer made of a Ni—Fe alloy, these sublayers being arranged in that order from the bottom, the enhancement sublayer be in contact with the insulating barrier layer, and the soft magnetic sublayer be in contact with the first protective layer. In conventional magnetic sensors, although the change in reluctance can be enhanced by the use of enhancement sublayers, the composition of the enhancement sublayers needs to be appropriately adjusted to enhance the change in reluctance, which causes a problem that free magnetic layers have high magnetostriction. However, in the tunneling magnetic sensor, the free magnetic layer is allowed to have low magnetostriction and the change in reluctance can be effectively enhanced in such a manner that the first protective layer made of Mg is provided on the free magnetic layer without adjusting the composition of the enhancement sublayer and without varying the configuration of the free magnetic layer.

In the tunneling magnetic sensor, the insulating barrier layer is made of aluminum oxide (Al—O) or a titanium oxide (Ti—O).

A method for manufacturing a tunneling magnetic sensor according to the present invention includes steps below.
(a) A step of forming a pinned magnetic layer and then forming a metal or sublayer layer on the pinned magnetic layer;
(b) a step of oxidizing the metal or sublayer layer into a insulating barrier layer;
(c) a step of forming a free magnetic layer on the insulating barrier layer; and
(d) a step of providing a first protective layer made of magnesium (Mg) on the free magnetic layer.

Therefore, the tunneling magnetic sensor can be manufactured appropriately and readily so as to have a large change in reluctance with the magnetostriction of the free magnetic layer being prevented.

In the method, it is preferable that the first protective layer be formed and a second protective layer made of tantalum (Ta) be then provided on the first protective layer in Step (d).

In the method, the first protective layer preferably has a thickness less than that of the second protective layer.

The method preferably further includes an annealing step subsequent to Step (d).

The tunneling magnetic sensor manufactured by the method has a larger change in reluctance as compared to conventional magnetic sensors and the free magnetic layer has lower magnetostriction as compared to free magnetic layers included in the conventional magnetic sensors.

DESCRIPTION OF THE PREFERRED EMBODIMENTS

Figure 1:
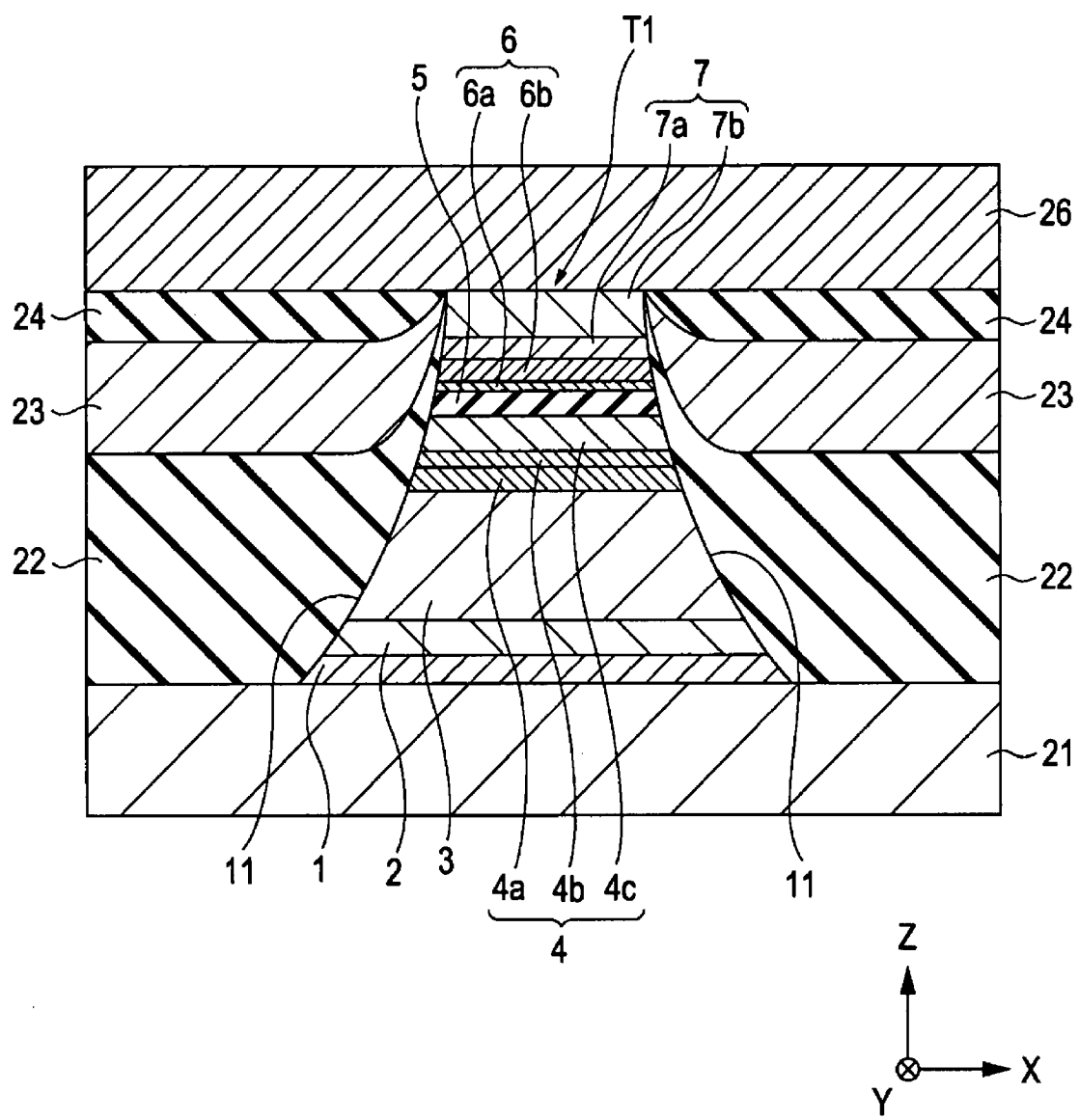
FIG. 1 is sectional view of a tunneling magnetic sensor according to an embodiment of the present invention, the tunneling magnetic sensor being viewed in the direction parallel to a surface of the tunneling magnetic sensor that is opposed to a recording medium.

FIG. 1 shows a tunneling magnetic sensor (tunneling magnetoresistive element) according to an embodiment of the present invention in cross section, the tunneling magnetic sensor being viewed in the direction parallel to a surface of the tunneling magnetic sensor that is opposed to a recording medium.

The tunneling magnetic sensor is used to detect a recording magnetic field from a hard disk in such a state that the tunneling magnetic sensor is attached to a trailing-side end portion of a floating slider placed in a hard disk drive. In FIGS. 1 to 5, an X-direction corresponds to the width direction of a track; a Y-direction corresponds to the direction (height direction) of a magnetic field leaking from a magnetic recording medium such as a hard disk; and a Z-direction corresponds to the moving direction of the magnetic recording medium or the thickness direction of each layer included in the tunneling magnetic sensor.

With reference to FIG. 1, the tunneling magnetic sensor includes a laminate T1, lower insulating layers 22, hard bias layers 23, and upper insulating layers 24. The lower insulating layers 22, the hard bias layers 23, and the upper insulating layers 24 are arranged on both sides of the laminate T1 in the X-direction. The laminate T1 is disposed on a lower shield layer 21 which is made of, for example, a Ni—Fe alloy and which is located at the lowermost position in FIG. 1.

The laminate T1 includes a base layer 1, a seed layer 2, an antiferromagnetic layer 3, a pinned magnetic layer 4, an insulating barrier layer 5, a free magnetic layer 6, and a protective layer 7. The base layer 1 is located at the bottom of the laminate T1 and is made of a non-magnetic material containing at least one selected from the group consisting of Ta, Hf, Nb, Zr, Ti, Mo, and W. The seed layer 2 is disposed on the base layer 1. The seed layer 2 is made of a Ni—Fe—Cr alloy or Cr. When the seed layer 2 is made of the Ni—Fe—Cr alloy, the seed layer 2 has a face-centered cubic (fcc) structure and equivalent crystal planes, represented by the {111} plane, preferentially oriented in the direction parallel to a face of the seed layer 2. When the seed layer 2 is made of Cr, the seed layer 2 has a body-centered cubic (bcc) structure and equivalent crystal planes, represented by the {110} plane, preferentially oriented in the direction parallel to a face of the seed layer 2. The laminate T1 need not necessarily include the base layer 1.

The antiferromagnetic layer 3 is disposed on the seed layer 2 and is preferably made of an antiferromagnetic material containing Mn and Element X that is at least one selected from the group consisting of Pt, Pd, Ir, Rh, Ru, and Os.

X—Mn alloys containing any one of the above platinum-group elements have high corrosion resistance, a high blocking temperature, and a large exchange coupling magnetic field (Hex) and therefore are antiferromagnetic materials having excellent properties.

Alternatively, the antiferromagnetic layer 3 may be made of an antiferromagnetic material containing Mn, Element X, and Element X' that is at least one selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

The pinned magnetic layer 4 is disposed on the antiferromagnetic layer 3. The pinned magnetic layer 4 has a synthetic ferri-structure and includes a first pinned magnetic sublayer 4a, a non-magnetic intermediate sublayer 4b, and a second pinned magnetic sublayer 4c, these sublayers being arranged in that order from the bottom. The magnetization of the first pinned magnetic sublayer 4a and that of the second pinned magnetic sublayer 4c are pinned antiparallel to each other by an exchange coupling magnetic field between the antiferromagnetic layer 3 and the first pinned magnetic sublayer 4a and an antiferromagnetic exchange coupling magnetic field through the non-magnetic intermediate sublayer 4b (the RKKY interaction). The synthetic ferri-structure is effective in maintaining the magnetization of the pinned magnetic layer 4 stable and effective in generating an apparently large exchange coupling magnetic field between the pinned magnetic layer 4 and the antiferromagnetic layer 3. The first and second pinned magnetic sublayers 4a and 4b preferably have a thickness of about 12 to 24 Å and the non-magnetic intermediate sublayer 4b preferably has a thickness of about 8 to 10 Å.

The first and second pinned magnetic sublayers 4a and 4b are preferably made of a ferromagnetic material such as a Co—Fe alloy, a Ni—Fe alloy, or a Co—Fe—Ni alloy. The non-magnetic intermediate sublayer 4b is preferably made of a non-magnetic material such as Ru, Rh, Ir, Cr, Re, or Cu.

The insulating barrier layer 5 is disposed on the pinned magnetic layer 4 and is preferably made of a titanium oxide (hereinafter referred to as Ti—O) or aluminum oxide (hereinafter referred to as Al—O). The insulating barrier layer 5 may be formed by sputtering using a Ti—O or Al—O target and is preferably formed in such a manner that a Ti or Al layer with a thickness of about 1 to 10 Å is formed and then oxidized. In the latter case, the Ti or Al layer is increased in thickness by oxidation. The insulating barrier layer 5 preferably has a thickness of about 1 to 20 Å. An excessive increase in the thickness of the insulating barrier layer 5 prevents the flow of a tunnel current. This is not preferable.

The free magnetic layer 6 is disposed on the insulating barrier layer 5. The free magnetic layer 6 includes a soft magnetic sublayer 6b made of a magnetic material such as a Ni—Fe alloy and an enhancement sublayer 6a which is made of a magnetic material such as a Co—Fe alloy and which is located between the soft magnetic sublayer 6b and the insulating barrier layer 5. The magnetic material for forming the soft magnetic sublayer 6b preferably has good soft magnetic properties. The magnetic material for forming the enhancement sublayer 6a preferably has a spin polarizability greater than that of the soft magnetic sublayer 6b. When the soft magnetic sublayer 6b is made of such a Ni—Fe alloy, the content of Ni in the Ni—Fe alloy is preferably greater than or equal to 81.5 atomic percent and less than 100 atomic percent in view of magnetic properties thereof.

When the enhancement sublayer 6a is made of such a Co—Fe alloy having high spin polarizability, the enhancement sublayer 6a has a large change in reluctance. Co—Fe alloys having a high Fe content have particularly high spin polarizability and have ability to greatly enhance the change in reluctance of devices. The content of Fe in the Co—Fe alloy is not particularly limited and may be ten to 90 atomic percent.

An excessive increase in the thickness of the enhancement sublayer 6a impairs the magnetic sensitivity of enhancement sublayer 6a; hence, the enhancement sublayer 6a preferably has a thickness less than that of the soft magnetic sublayer 6b. The soft magnetic sublayer 6b preferably has a thickness of about 30 to 70 Å. The enhancement sublayer 6a preferably has a thickness of about 6 to 20 Å and more preferably about 10 Å.

The free magnetic layer 6 may have a synthetic ferri-structure in which a plurality of magnetic sublayers and non-magnetic intermediate sublayers are arranged alternately. A track width Tw is defined as the width of the free magnetic layer 6 in the X-direction.

The protective layer 7 is disposed on the free magnetic layer 6.

The laminate T1 having the above configuration is disposed on the lower shield layer 21. The laminate T1 has two end faces 11 arranged in the X-direction. The end faces 11 are sloped upward such that the width of the free magnetic layer 6 in the X-direction is reduced.

With reference to FIG. 1, the lower insulating layers 22 extend over the lower shield layer 21, extending under the laminate T1, and the end faces 11 of the laminate T1. The hard bias layers 23 and the upper insulating layers 24 are arranged on the lower insulating layers 22 in that order.

A bias base layer (not shown) may be disposed between each lower insulating layer 22 and each hard bias layer 23. The bias base layer is made of, for example, Cr, W, or Ti.

The lower and upper insulating layers 22 and 24 are made of an insulating material such as $Al_2O_3$ or $SiO_2$ and electrically insulate the hard bias layers 23 so as to prevent a current, flowing in the laminate T1 perpendicularly to the interfaces between the above layers, from being branched in the X-direction. The hard bias layers 23 are made of, for example, a cobalt-platinum (Co—Pt) alloy or a cobalt-chromium-platinum (Co—Cr—Pt) alloy.

An upper shield layer 26 made of a Ni—Fe alloy or the like extends over the laminate T1 and the upper insulating layers 24.

With reference to FIG. 1, the lower and upper shield layers 21 and 26 serve as electrodes for applying a current across the laminate T1 in the direction perpendicular to the interfaces between the layers of laminate T1, that is, in the direction parallel to the Z-direction.

The free magnetic layer 6 is magnetized in parallel to the X-direction by a bias magnetic field generated from the hard bias layers 23. The first and second pinned magnetic sublayer 4a and 4c, which are included in the pinned magnetic layer 4, are magnetized in parallel to the Y-direction. Since the pinned magnetic layer 4 has the synthetic ferri-structure as described above, the first and second pinned magnetic sublayer 4a and 4c are magnetized in antiparallel to each other. The magnetization of the free magnetic layer 6 is pinned (that is, the magnetization of the free magnetic layer 6 is not varied by any external magnetic field) but the magnetization of the free magnetic layer 6 is varied by an external magnetic field.

If the magnetization of the free magnetic layer 6 is varied by the external magnetic field so as to be antiparallel to that of the second pinned magnetic sublayer 4c, a tunnel current is prevented from flowing through the insulating barrier layer 5, which is located between the second pinned magnetic sublayer 4c and the free magnetic layer 6, resulting in the maximum resistance. In contrast, if the magnetization of the free magnetic layer 6 is parallel to that of the second pinned magnetic sublayer 4c, the tunnel current readily flows through the insulating barrier layer 5, resulting in the minimum resistance.

Since the magnetization of the free magnetic layer 6 is varied by the external magnetic field, the tunneling magnetic sensor uses this principle to detect a change in electric resistance as a change in voltage to detect a magnetic field leaking from a recording medium.

In the tunneling magnetic sensor, the protective layer 7 is disposed on the free magnetic layer 6. The protective layer 7 includes a first protective sublayer 7a made of magnesium (Mg) and a second protective sublayer 7b made of a nonmagnetic material other than Mg, the first and second protective sublayers 7a and 7b being arranged on the free magnetic layer 6 in that order.

This is effective in increasing the change in reluctance and effective in preventing the significant increase in the magnetostriction of the free magnetic layer 6.

As is clear from experiment results below, any sensors including first protective sublayers 7a made of a material other than Mg have a smaller change in reluctance as compared to the tunneling magnetic sensor, which includes the first protective sublayer 7a made of Mg. That is, the tunneling magnetic sensor has a larger change in reluctance as compared to that of conventional magnetic sensors. The term "conventional magnetic sensors" herein means magnetic sensors which have a configuration similar to that of the tunneling magnetic sensor except that the magnetic sensors include no first protective sublayer 7a.

If the first protective sublayer 7a is made of copper (Cu), the tunneling magnetic sensor has a change in reluctance seriously less than that of the conventional magnetic sensors. Alternatively, if the first protective sublayer 7a is made of aluminum (Al), the tunneling magnetic sensor has a change in reluctance seriously less than that of the conventional magnetic sensors. If the insulating barrier layer 5 is made of Ti—O, the tunneling magnetic sensor has a change in reluctance insufficient for evaluation. The tunneling magnetic sensor, which includes the first protective sublayer 7a made of Mg, has a change in reluctance greater than that of the conventional magnetic sensors.

Although the first protective sublayer 7a is made of Mg, an increase in the magnetostriction of the free magnetic layer 6 can be reduced in contrast to that of the conventional magnetic sensors. The magnetostriction of the free magnetic layer 6 can be prevented from being increased and the tunneling magnetic sensor has a larger change in reluctance as compared to that of the conventional magnetic sensors.

In the tunneling magnetic sensor, the protective layer 7 includes two layers: the first and second protective sublayers 7a and 7b as shown in FIG. 1. The number of sublayers included in the protective layer 7 is not limited to two. The protective layer 7 may include three or more sublayers. In this case, the first protective sublayer 7a is made of Mg and located on the free magnetic layer 6.

The second protective sublayer 7b may be made of at least one of the following materials: metals such as Ta, Ti, Al, Cu, Cr, Fe, Ni, Mn, Co, and V; oxides of the metals, and nitrides of the metals. These materials have been used to form protective layers. In view of mechanical protection, the second protective sublayer 7b is preferably made of Ta because Ta is resistant to oxidation and has low electric resistance. The first protective sublayer 7a, which is made of Mg, is readily oxidized. If the free magnetic layer 6 is oxidized, properties thereof are impaired. Therefore, the second protective sublayer 7b, which is made of Ta, is provided on the first protective sublayer 7a such that the free magnetic layer 6 is prevented from being oxidized. This allows the tunneling magnetic sensor to have stable properties.

The first protective sublayer 7a can be formed by sputtering an Mg target. The first protective sublayer 7a preferably has a thickness of about 2 to 100 Å and more preferably 10 to 30 Å. When the thickness of the first protective sublayer 7a is outside the above range, a large change in reluctance cannot be probably achieved or the increase in the magnetostriction of the free magnetic layer 6 cannot be probably prevented.

The laminate T1 is annealed (heat-treated) in a manufacturing step as described below. The annealing temperature of the laminate T1 is about 240° C. to 310° C. The laminate T1 is annealed in a magnetic field such that an exchange coupling magnetic field (Hex) is generated between the first pinned magnetic sublayer 4a, which is included in the pinned magnetic layer 4, and the antiferromagnetic layer 3.

When the annealing temperature thereof is lower than 240° C. or when the annealing temperature thereof is about 240° C. to 310° C. and the annealing time thereof is less than four hours, the interface between the first protective sublayer 7a and the free magnetic layer 6 and the interface between the first and second protective sublayers 7a and 7b may be probably maintained because elements in these members hardly diffuse through the interfaces or only trace amounts of the elements diffuse through the interfaces (for example, the elements do not probably diffuse through the whole of each interface but diffuse through only a small portion of the interface).

When the annealing temperature thereof is higher than 310° C. or the annealing time thereof is four hours or more, the elements diffuse through the interfaces and therefore the interfaces disappear. This establishes the concentration gradient of Mg in the first protective sublayer 7a, that is, this allows the concentration of Mg in the first protective sublayer 7a to gradually decrease from a center portion of the first protective sublayer 7a toward the interface between the free magnetic layer 6 and the insulating barrier layer 5 (that is, in the downward direction in FIG. 1) and toward the upper face of the second protective sublayer 7b (that is, in the upward direction in FIG. 1).

The results of experiments (Examples and Comparative Examples) described below show that the tunneling magnetic sensor, which includes the first protective sublayer 7a made of Mg, has a larger increased change in reluctance as compared to the conventional magnetic sensors. This suggests that Mg in the first protective sublayer 7a may exert an influence on the free magnetic layer 6 next thereto. If the concentration gradient of Mg is established by the above annealing treatment, the free magnetic layer 6 is probably greatly influenced by Mg therein. On the other hand, the coercive force (Hc) of the free magnetic layer 6 and the interlayer coupling magnetic field between the free magnetic layer 6 and the pinned magnetic layer 4 are close to those of the conventional magnetic sensors and the increase in the magnetostriction of the free magnetic layer 6 can be appropriately prevented. This shows that Mg therein does not impair soft magnetic properties of the free magnetic layer 6.

In this embodiment, it is preferable that the free magnetic layer 6 include the enhancement sublayer 6a and the soft magnetic sublayer 6b as described above. Since the enhancement sublayer 6a is made of the Co—Fe alloy, the enhancement sublayer 6a has higher spin polarizability as compared to the soft magnetic sublayer 6b and is effective in enhancing the change in reluctance. In the conventional magnetic sensors, although the change in reluctance can be enhanced by the use of enhancement sublayers, the composition of the enhancement sublayers needs to be appropriately adjusted to enhance the change in reluctance, which causes a problem that free magnetic layers have high magnetostriction. However, in this embodiment, the increase in the magnetostriction of the free magnetic layer 6 can be prevented and the change in reluctance can be effectively enhanced in such a manner that the first protective sublayer 7a made of Mg is provided on the free magnetic layer 6 without adjusting the composition of the enhancement sublayer 6a and without varying the configuration of the free magnetic layer 6.

In this embodiment, the protective layer 7 may include only the first protective sublayer 7a, which is made of Mg. However, the protective layer 7 preferably includes the first protective sublayer 7a and the second protective sublayer 7b, which is made of Ta and disposed on the first protective sublayer 7a, because Mg in the first protective sublayer 7a is oxidized in manufacturing steps and the oxidation of Mg can cause a problem that properties of the free magnetic layer 6 are impaired. The second protective sublayer 7b preferably has a thickness greater than that of the first protective sublayer 7a.

Figure 2:
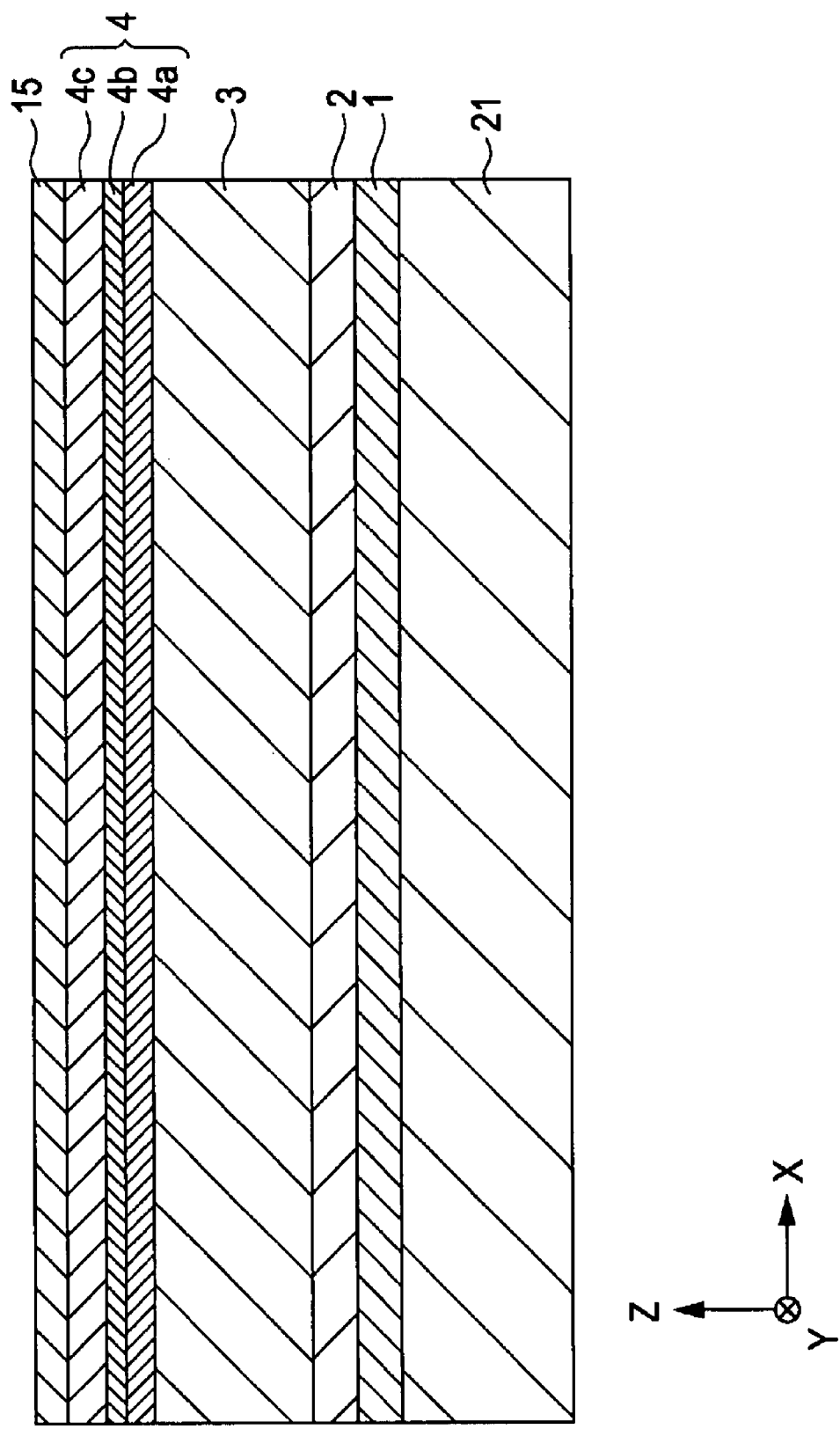
FIG. 2 is a sectional view showing a step of a method for manufacturing the tunneling magnetic sensor, the tunneling magnetic sensor being viewed in the direction parallel to the tunneling magnetic sensor surface opposed to the recording medium.
Figure 3:
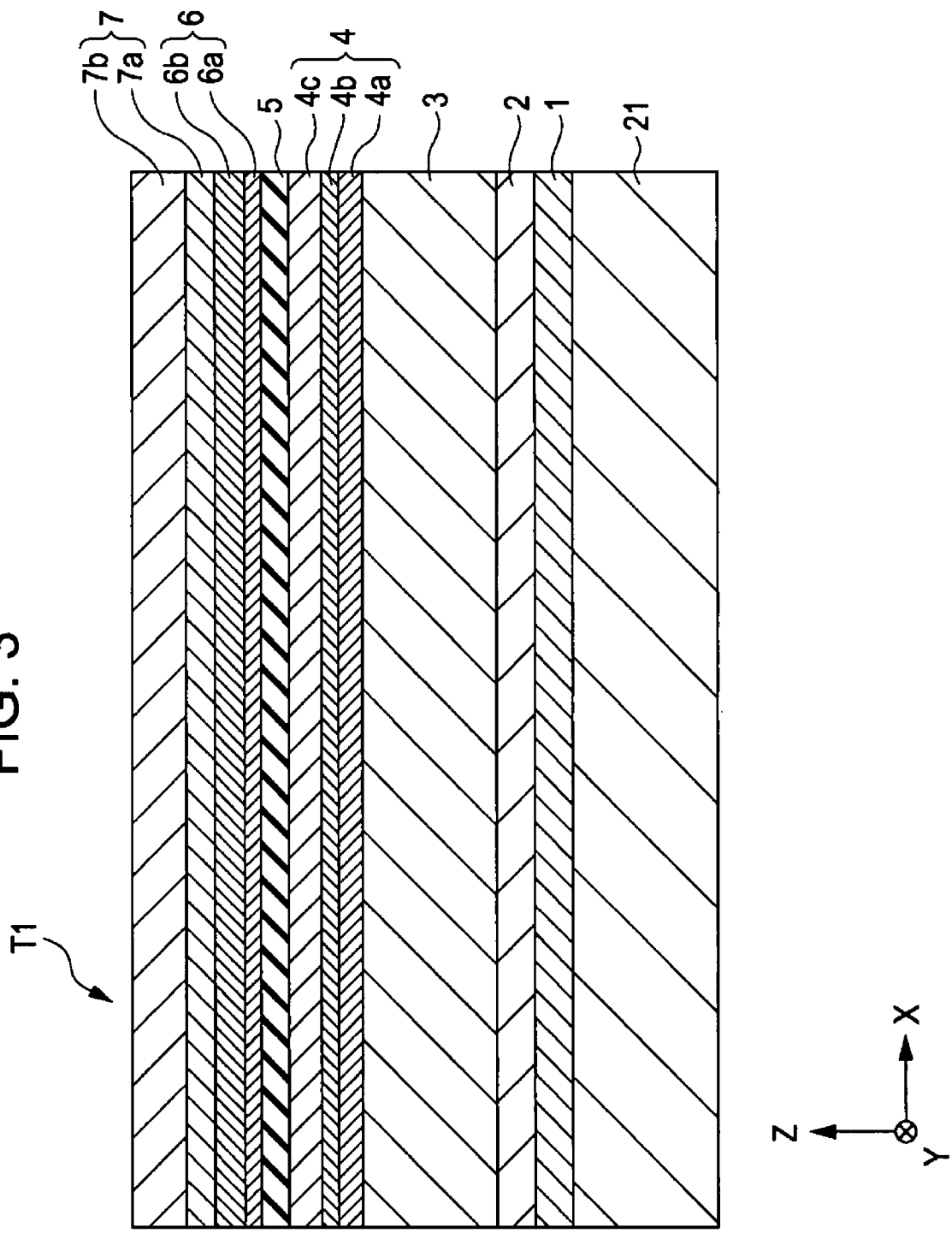
FIG. 3 is a sectional view showing a step subsequent to the step shown in FIG. 2.
Figure 4:
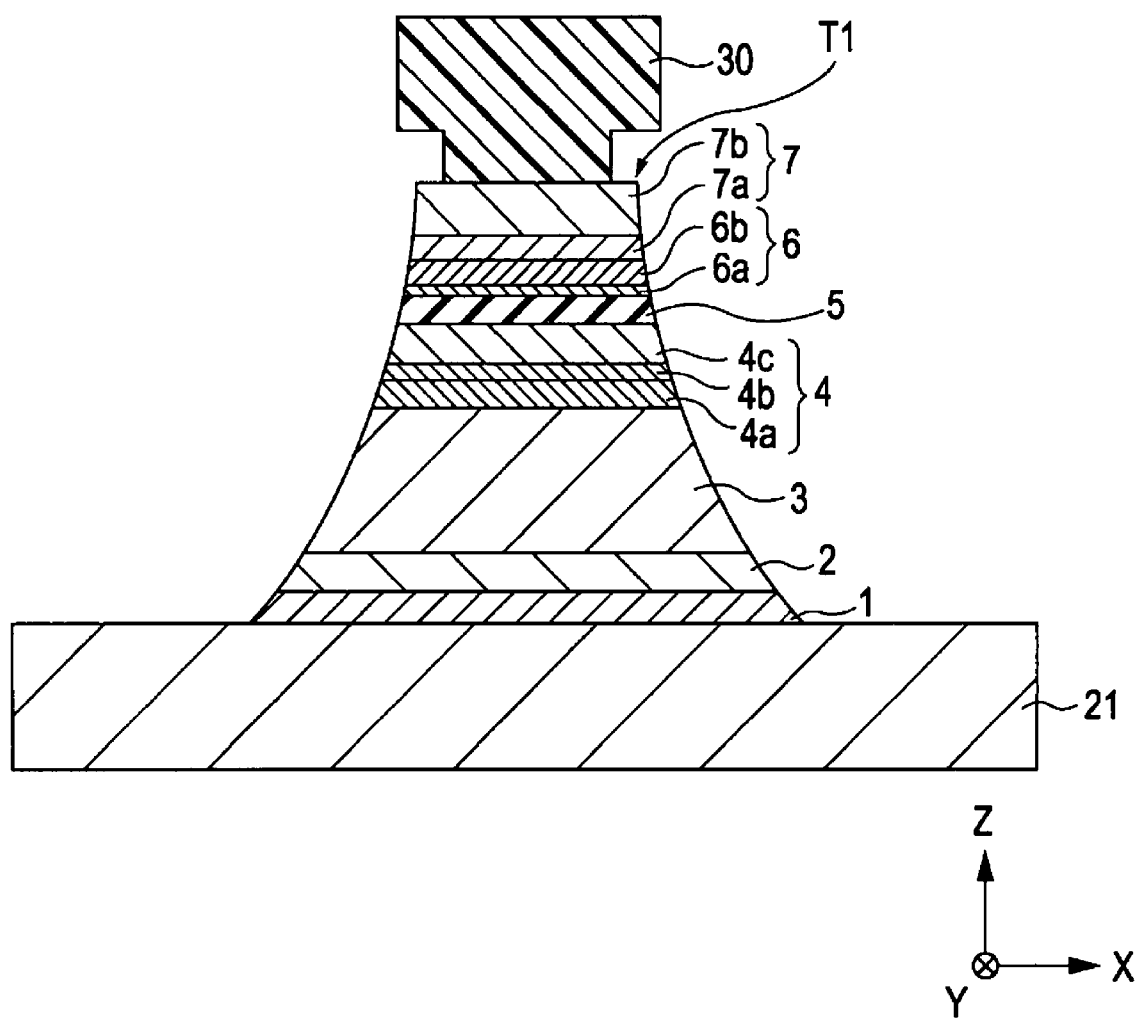
FIG. 4 is a sectional view showing a step subsequent to the step shown in FIG. 3.

A method for manufacturing the tunneling magnetic sensor according to the present invention will now be described. FIGS. 2 to 4 show steps of manufacturing the tunneling magnetic sensor in partial cross section, the tunneling magnetic sensor being viewed in the same direction as that in FIG. 1.

In the step shown in FIG. 2, the following members are continuously formed on the lower shield layer 21 placed in a vacuum chamber in this order: the base layer 1, the seed layer 2, the antiferromagnetic layer 3, the first pinned magnetic sublayer 4a, the non-magnetic intermediate sublayer 4b, and the second pinned magnetic sublayer 4c.

A metal layer 15 is formed on the second pinned magnetic sublayer 4c by a sputtering process or another process. Since the metal layer 15 is oxidized into the insulating barrier layer 5 in a subsequent step, the metal layer 15 is formed such that the thickness of the oxidized metal layer 15 is equal to the thickness of the insulating barrier layer 5.

Gaseous oxygen is introduced into the vacuum chamber, whereby the metal layer 15 is oxidized into the insulating barrier layer 5. A semiconductor layer may be formed instead of the metal layer 15 and then oxidized into the insulating barrier layer 5.

As shown in FIG. 3, the enhancement sublayer 6a and the soft magnetic sublayer 6b are formed on the insulating barrier layer 5 in that order, whereby the free magnetic layer 6 is formed. Mg is deposited on the free magnetic layer 6, whereby the first protective sublayer 7a is formed. The second protective sublayer 7b is formed on the first protective sublayer 7a. This provides the laminate T1 including the base layer 1 to the protective layer 7.

As shown in FIG. 4, a lift-off resist layer 30 is formed on the laminate T1. Both side end portions of the laminate T1 that are arranged in the X-direction and that are not covered with the lift-off resist layer 30 are etched off.

Figure 5:
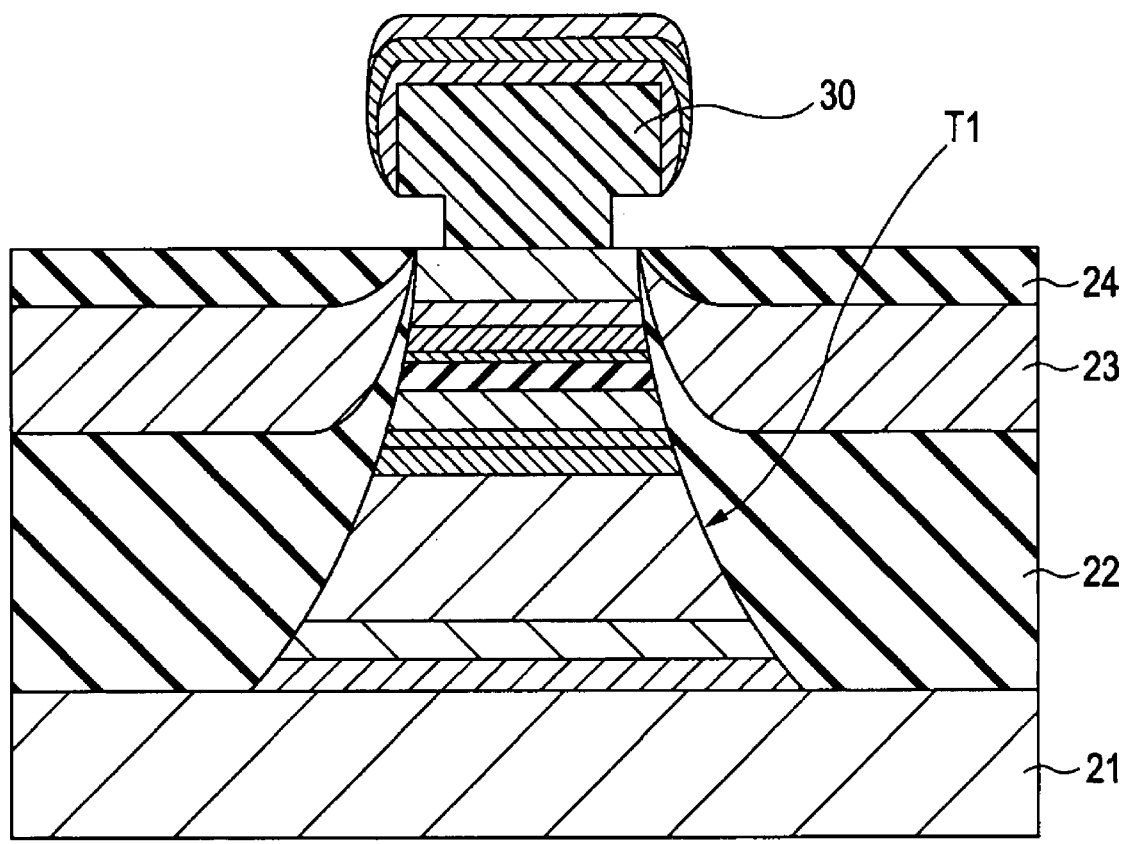
FIG. 5 is a sectional view showing a step subsequent to the step shown in FIG. 4.

As shown in FIG. 5, the lower insulating layers 22, the hard bias layers 23, and the upper insulating layers 24 are deposited on the lower shield layer 21 in that order such that these layers are arranged on both sides of the laminate T1 in the X-direction.

The lift-off resist layer 30 is removed from the laminate T1. The upper shield layer 26 is then formed over the laminate T1 and the upper insulating layers 24.

The method includes a step of annealing the laminate T1. The laminate T1 is annealed such that an exchange coupling magnetic field (Hex) is generated between the antiferromagnetic layer 3 and the first pinned magnetic sublayer 4a. The annealing temperature of the laminate T1 is about 240° C. to 310° C.

When the annealing temperature thereof is lower than 240° C. or when the annealing temperature thereof is about 240° C. to 310° C. and the annealing time thereof is less than four hours, the interface between the first protective sublayer 7a and the free magnetic layer 6 and the interface between the first and second protective sublayers 7a and 7b may be probably maintained because elements in these members hardly diffuse through the interfaces or only trace amounts of the elements diffuse through the interfaces (for example, the elements do not probably diffuse through the whole of each interface but diffuse through only a small portion of the interface).

When the annealing temperature thereof is higher than 310° C. or the annealing time thereof is four hours or more, the elements diffuse through the interfaces and therefore the interfaces disappear. This establishes the concentration gradient of Mg in the first protective sublayer 7a, that is, this allows the concentration of Mg in the first protective sublayer 7a to gradually decrease from a center portion of the first protective sublayer 7a toward the interface between the free magnetic layer 6 and the insulating barrier layer 5 (that is, in the downward direction in FIG. 1) and toward the upper face of the second protective sublayer 7b (that is, in the upward direction in FIG. 1).

Examples of a technique for oxidizing the metal layer 15 into the insulating barrier layer 5 include radical oxidation, ion oxidation, plasma oxidation, and natural oxidation.

The tunneling magnetic sensor, which has a larger change in reluctance and in which the increase in the magnetostriction of the free magnetic layer 6 can be prevented, can be manufactured by the method more appropriately and readily than conventional tunneling magnetic sensors.

In this embodiment, it is preferable the metal layer 15 be made of Ti or Al and therefore the insulating barrier layer 5 be made of Ti—O or Al—O, respectively, because the increase in the magnetostriction of the free magnetic layer 6 can be effectively prevented and a large change in reluctance can be achieved.

EXAMPLES

Tunneling magnetic sensors were prepared so as to have configurations similar to the configuration of the tunneling magnetic sensor shown in FIG. 1.

In Example 1, a tunneling magnetic sensor including an insulating barrier layer 5 made of Al—O was prepared as described below.

The following layers were deposited on a lower shield layer 21 in this order: a base layer 1, made of Ta, having an average thickness of about 80 Å; a seed layer 2, made of a Ni—Fe—Cr alloy, having an average thickness of about 50 Å; an antiferromagnetic layer 3, made of an Ir—Mn alloy, having an average thickness of about 70 Å; a pinned magnetic layer 4 including a first pinned magnetic sublayer 4a which contained about 70 atomic percent Co and 30 atomic percent Fe and which had an average thickness of about 14 Å, a non-magnetic intermediate sublayer 4b which was made of Ru and which had an average thickness of about 9.1 Å, and a second pinned magnetic sublayer 4c which contained about 60 atomic percent Co, 20 atomic percent Fe, and 20 atomic percent B and which had an average thickness of about 18 Å; and a metal layer 15, made of Al, having an average thickness of about 3.0 Å. The metal layer 15 was oxidized into the insulating barrier layer 5 made of Al—O. The following layers were deposited on the insulating barrier layer 5: a free magnetic layer 6 including an enhancement sublayer 6a which contained about 70 atomic percent Co and 30 atomic percent Fe and which had an average thickness of about 10 Å and a soft magnetic sublayer 6b which contained about 83.5 atomic percent Ni and 16.5 atomic percent Fe and which had an average thickness of about 40 Å and then a protective layer 7 including a first protective sublayer 7a, made of Mg, having an average thickness of about 20 Å and a second protective sublayer 7b, made of Ta, having an average thickness of about 180 Å. This resulted in the formation of a laminate T1.

The laminate T1 was annealed at about 270° C. for 3.5 hours.

Table 1 shows the change in reluctance of the tunneling magnetic sensor, the magnetostriction of the free magnetic layer 6, the coercive force of the free magnetic layer 6, the interlayer coupling magnetic field between the pinned magnetic layer 4 and the free magnetic layer 6.

In Comparative Examples 1 to 4, tunneling magnetic sensors including first protective sublayers 7a made of different materials were prepared. The first protective sublayer 7a of Comparative Example 1 was made of Al, the first protective sublayer 7a of Comparative Example 2 was made of Ti, the first protective sublayer 7a of Comparative Example 3 was made of Cu, and the first protective sublayer 7a of Comparative Example 4 was made of an Ir—Mn alloy. These first protective sublayers 7a, as well as the first protective sublayer 7a of Example 1, had a thickness of about 20 Å. In Comparative Example 5, the following sensor was prepared: a tunneling magnetic sensor including a protective layer 7 including no first protective sublayers 7a but only a second protective sublayer 7b, made of Ta, having a thickness of about 200 Å. Table 1 also shows properties of these tunneling magnetic sensors.

TABLE 1

| Material for forming first protective sublayer | | ΔR/R*[1] (%) | λ*[2] (ppm) | Hc*[3] (Oe)*[5] | Hin*[4] (Oe) |
|---|---|---|---|---|---|
| Example 1 | Mg | 29.30 | 5.6 | 2.5 | 8.2 |
| Comparative Example 1 | Al | 18.34 | 7.2 | 3.0 | 5.7 |
| Comparative Example 2 | Ti | 25.15 | 5.4 | 2.6 | 7.3 |
| Comparative Example 3 | Cu | 6.11 | 4.3 | 2.4 | 3.5 |
| Comparative Example 4 | IrMn | 12.51 | 4.7 | 2.2 | 7.9 |
| Comparative Example 5 | None | 27.15 | 3.6 | 2.4 | 7.3 |

※1 Oe ≈ 79 A/m
*[1] ΔR/R represents the change in reluctance.
*[2] λ represents the magnetostriction.
*[3] Hc represents the coercive force.
*[4] Hin represents the interlayer coupling magnetic field.
*[5] 1 Oe is nearly equal to 79 A/m.

In Example 2, a tunneling magnetic sensor including an insulating barrier layer 5 made of Ti—O was prepared as described below.

The following layers were deposited on a lower shield layer 21 in this order: a base layer 1, made of Ta, having an average thickness of about 80 Å; a seed layer 2, made of a Ni—Fe—Cr alloy, having an average thickness of about 50 Å; an antiferromagnetic layer 3, made of an Ir—Mn alloy, having an average thickness of about 70 Å; a pinned magnetic layer 4 including a first pinned magnetic sublayer 4a which contained about 70 atomic percent Co and 30 atomic percent Fe and which had an average thickness of about 14 Å, a non-magnetic intermediate sublayer 4b which was made of Ru and which had an average thickness of about 9.1 Å, and a second pinned magnetic sublayer 4c which contained about 90 atomic percent Co and 10 atomic percent Fe and which had an average thickness of about 18 Å; and a metal layer 15, made of Ti, having an average thickness of about 5.6 Å. This metal layer 15 was oxidized into this insulating barrier layer 5 made of Ti—O. The following layers were deposited on this insulating barrier layer 5: a free magnetic layer 6 including an enhancement sublayer 6a which contained about 50 atomic percent Co and 50 atomic percent Fe and which had an average thickness of about 10 Å and a soft magnetic sublayer 6b which contained about 86 atomic percent Ni and 14 atomic percent Fe and which had an average thickness of about 40 Å and then a protective layer 7 including a first protective sublayer 7a, made of Mg, having an average thickness of about 20 Å and a second protective sublayer 7b, made of Ta, having an average thickness of about 180 Å. This resulted in the formation of a laminate T1.

This laminate T1 was annealed at about 270° C. for 3.5 hours.

Table 2 shows the change in reluctance of this tunneling magnetic sensor, the magnetostriction of this free magnetic layer 6, the coercive force of this free magnetic layer 6, the interlayer coupling magnetic field between this pinned magnetic layer 4 and this free magnetic layer 6.

In Comparative Examples 6 to 9, tunneling magnetic sensors including first protective sublayers 7a made of different materials were prepared. The first protective sublayer 7a of Comparative Example 6 was made of Al, the first protective sublayer 7a of Comparative Example 7 was made of Ti, the first protective sublayer 7a of Comparative Example 8 was made of Cu, and the first protective sublayer 7a of Comparative Example 9 was made of an Ir—Mn alloy. These first protective sublayers 7a, as well as the first protective sublayer 7a of Example 2, had a thickness of about 20 Å. In Comparative Example 10, the following sensor was prepared: a tunneling magnetic sensor including no first protective sublayers 7a but only a second protective sublayer 7b made of Ta. The tunneling magnetic sensor of Comparative Example 5 had a thickness of about 200 Å. Since the first protective sublayer 7a of Comparative Example 6 was made of Al, the change in reluctance of the tunneling magnetic sensor of Comparative Example 6 was too small to be measured. Table 2 also shows properties of these tunneling magnetic sensors.

TABLE 2

| Material for forming first protective sublayer | | ΔR/R*[1] (%) | λ*[2] (ppm) | Hc*[3] (Oe)*[5] | Hin*[4] (Oe) |
|---|---|---|---|---|---|
| Example 2 | Mg | 25.12 | 4.4 | 4.4 | 16.8 |
| Comparative Example 6 | Al | — | 5.0 | 4.4 | 27.5 |
| Comparative Example 7 | Ti | 15.59 | 5.0 | 4.3 | 20.7 |
| Comparative Example 8 | Cu | 20.91 | 2.6 | 4.7 | 15.3 |

TABLE 2-continued

| Material for forming first protective sublayer | ΔR/R*[1] (%) | λ*[2] (ppm) | Hc*[3] (Oe)*[5] | Hin*[4] (Oe) |
|---|---|---|---|---|
| Comparative Example 9 | IrMn | 10.24 | 4.6 | 4.0 | 14.3 |
| Comparative Example 10 | None | 22.10 | 3.5 | 4.1 | 16.2 |

※1 Oe ≈ 79 A/m
*[1]ΔR/R represents the change in reluctance.
*[2]λ represents the magnetostriction.
*[3]Hc represents the coercive force.
*[4]Hin represents the interlayer coupling magnetic field.
*[5]1 Oe is nearly equal to 79 A/m.

Figure 6:
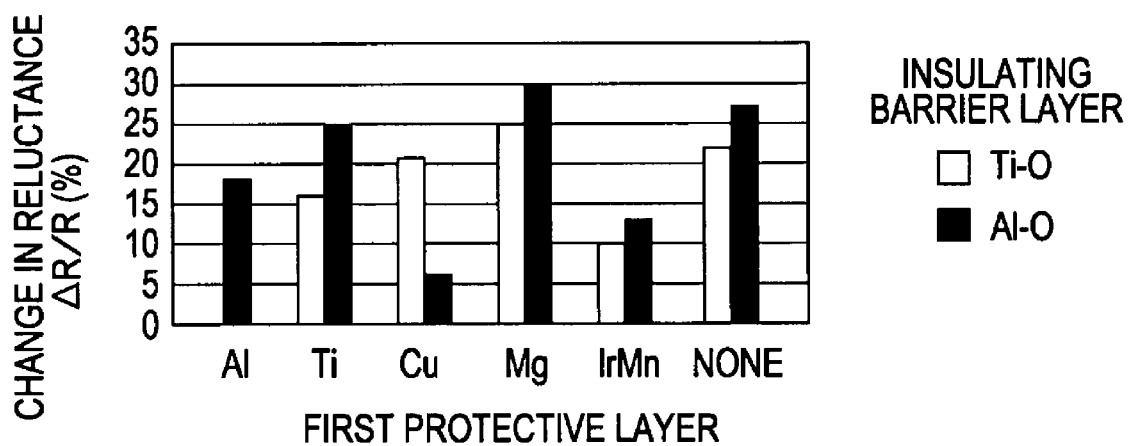
FIG. 6 is a bar graph showing the change in reluctance of each of tunneling magnetic sensors which each include a first protective sublayer made of Mg, Al, Ti, Cu, or an Ir—Mn alloy or which include no first protective sublayer.
Figure 7:
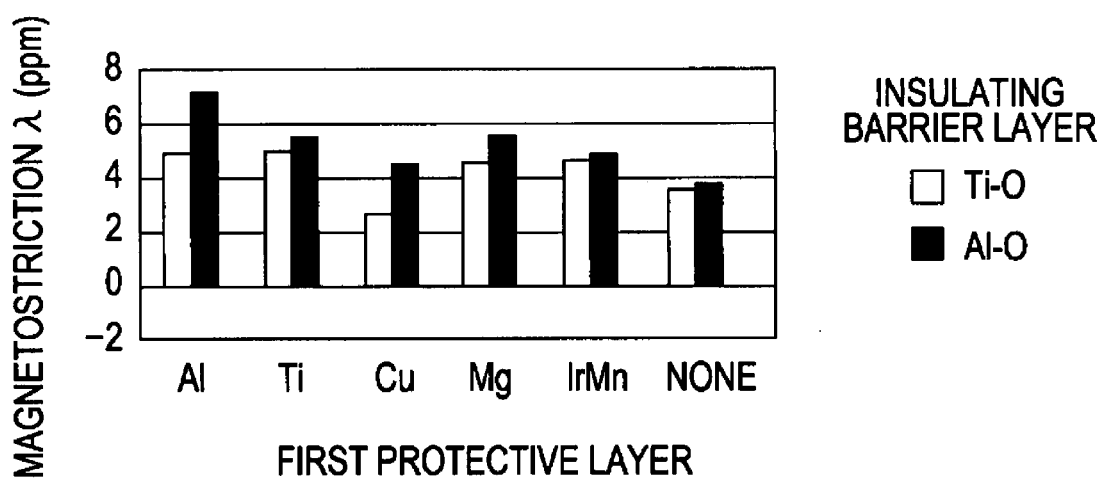
FIG. 7 is a bar graph showing the magnetostriction of each of free magnetic layers included in the tunneling magnetic sensors.

FIG. 6 is a bar graph, based on Table 1, showing the change in reluctance of each tunneling magnetic sensor and FIG. 7 is a bar graph, based on Table 2, showing the magnetostriction of each free magnetic layer 6.

As is clear from Tables 1 and 2 and FIGS. 6 and 7, the tunneling magnetic sensors of Examples 1 and 2 each have a larger change in reluctance as compared to the tunneling magnetic sensors of Comparative Example 5 and 10. This is because the tunneling magnetic sensor of Example 1 includes the first protective sublayer 7a made of Mg and the insulating barrier layer 5 made of Al—O and the tunneling magnetic sensor of Example 2 includes the first protective sublayer 7a made of Mg and the insulating barrier layer 5 made of Ti—O although the tunneling magnetic sensor of Comparative Example 5 includes the protective layer 7 including no first protective sublayer 7a but the second protective sublayer 7b only and the insulating barrier layer 5 made of Al—O and the tunneling magnetic sensor of Comparative Example 10 includes the protective layer 7 including no first protective sublayer 7a but the second protective sublayer 7b only and the insulating barrier layer 5 made of Ti—O. In the tunneling magnetic sensors of Examples 1 and 2, an increase in the magnetostriction of each free magnetic layer 6 is only slight. The tunneling magnetic sensors of Comparative Examples 1 to 4 and 6 to 9 each have a smaller change in reluctance as compared to the tunneling magnetic sensors of Comparative Examples 5 and 10. This is because the tunneling magnetic sensors of Comparative Examples 1 to 4 include the first protective sublayers 7a made of Al, Ti, Cu, or the Ir—Mn alloy and the insulating barrier layers 5 made of Al—O and the tunneling magnetic sensors of Comparative Examples 6 to 9 include the first protective sublayers 7a made of Al, Ti, Cu, or the Ir—Mn alloy and the insulating barrier layers 5 made of Ti—O.

These show that the first protective sublayer 7a made of Mg are effective in preventing the increase in the magnetostriction of the free magnetic layers 6 and effective in increasing the change in reluctance of the tunneling magnetic sensors.

As shown in Tables 1 and 2, the coercive forces of the free magnetic layers 6 and the interlayer coupling magnetic fields between the pinned magnetic layers 4 and free magnetic layers 6 of Examples 1 and 2 are close to those of Comparative Examples 5 and 10. This shows that the presence of the first protective sublayers 7a, made of Mg, on the free magnetic layers 6 does not impair magnetic properties of the tunneling magnetic sensors of the Examples 1 and 2.

What is claimed is:

1. A tunneling magnetic sensor comprising:
a pinned magnetic layer of which the magnetization is pinned in one direction;
an insulating barrier layer; and
a free magnetic layer of which the magnetization is varied by an external magnetic field, these layers being arranged in that order from the bottom,
wherein a first protective layer made of magnesium (Mg) is disposed on the free magnetic layer; and
a second protective layer, made of tantalum (Ta), is disposed on the first protective layer.

2. The tunneling magnetic sensor according to claim 1, wherein elements contained in the first protective layer and the free magnetic layer diffuse through the interface between the first protective layer and the free magnetic layer and the concentration gradient of magnesium is established such that the concentration of magnesium in the first protective layer gradually decreases from an internal portion of the first protective layer toward the interface between the free magnetic layer and the insulating barrier layer.

3. The tunneling magnetic sensor according to claim 1, wherein the first protective layer has a thickness less than that of the second protective layer.

4. The tunneling magnetic sensor according to claim 1, wherein elements contained in the first and second protective layers diffuse through the interface between the first and second protective layers and the concentration gradient of magnesium is established such that the concentration of magnesium in the first protective layer gradually decreases from an internal portion of the first protective layer toward the upper face of the second protective layer.

5. A tunneling magnetic sensor comprising:
a pinned magnetic layer of which the magnetization is pinned in one direction;
an insulating barrier layer; and
a free magnetic layer of which the magnetization is varied by an external magnetic field, these layers being arranged in that order from the bottom,
wherein a first protective layer made of magnesium (Mg) is disposed on the free magnetic layer; and
wherein the insulating barrier layer is made of a titanium oxide (Ti—O).

6. A tunneling magnetic sensor comprising:
a pinned magnetic layer of which the magnetization is pinned in one direction;
an insulating barrier layer; and
a free magnetic layer of which the magnetization is varied by an external magnetic field, these layers being arranged in that order from the bottom,
wherein a first protective layer made of magnesium (Mg) is disposed on the free magnetic layer; and
wherein the free magnetic layer includes an enhancement sublayer made of a Co—Fe alloy and a soft magnetic sublayer made of a Ni—Fe alloy, these sublayers being arranged in that order from the bottom, the enhancement sublayer is in contact with the insulating barrier layer, and the soft magnetic sublayer is in contact with the first protective layer.

7. A tunneling magnetic sensor comprising:
a pinned magnetic layer of which the magnetization is pinned in one direction;
an insulating barrier layer; and
a free magnetic layer of which the magnetization is varied by an external magnetic field, these layers being arranged in that order from the bottom,
wherein a first protective layer made of magnesium (Mg) is disposed on the free magnetic layer; and
wherein the insulating barrier layer is made of aluminum oxide (Al—O).

* * * * *